United States Patent
Hwang et al.

(10) Patent No.: US 9,323,469 B2
(45) Date of Patent: Apr. 26, 2016

(54) MEMORY, AND METHOD OF READING DATA FROM THE MEMORY

(75) Inventors: Tae Sun Hwang, Gyeonggi-do (KR); In Sun Park, Gyeonggi-do (KR)

(73) Assignee: INDUSTRIAL BANK OF KOREA, Seoul (KR)

( * ) Notice: Subject to any disclaimer, the term of this patent is extended or adjusted under 35 U.S.C. 154(b) by 386 days.

(21) Appl. No.: 14/009,309

(22) PCT Filed: Mar. 22, 2012

(86) PCT No.: PCT/KR2012/002049
§ 371 (c)(1),
(2), (4) Date: Oct. 1, 2013

(87) PCT Pub. No.: WO2012/134098
PCT Pub. Date: Oct. 4, 2012

(65) Prior Publication Data
US 2014/0244906 A1 Aug. 28, 2014

(30) Foreign Application Priority Data
Apr. 1, 2011 (KR) .................. 10-2011-0030375

(51) Int. Cl.
| | |
|---|---|
| G06F 3/06 | (2006.01) |
| G11C 16/04 | (2006.01) |
| G11C 16/08 | (2006.01) |
| G11C 16/24 | (2006.01) |
| G11C 16/26 | (2006.01) |
| G11C 16/32 | (2006.01) |
| G11C 7/22 | (2006.01) |
| G11C 8/16 | (2006.01) |
| G06F 12/00 | (2006.01) |

(52) U.S. Cl.
CPC .............. *G06F 3/064* (2013.01); *G06F 3/0619* (2013.01); *G06F 3/0688* (2013.01); *G11C 7/22* (2013.01); *G11C 8/16* (2013.01); *G11C 16/0483* (2013.01); *G11C 16/08* (2013.01); *G11C 16/24* (2013.01); *G11C 16/26* (2013.01); *G11C 16/32* (2013.01); *G11C 2216/30* (2013.01)

(58) Field of Classification Search
None
See application file for complete search history.

(56) References Cited

U.S. PATENT DOCUMENTS

| | | | |
|---|---|---|---|
| 4,821,226 A | 4/1989 | Christopher et al. | |
| 2006/0067123 A1 | 3/2006 | Jigour et al. | |

(Continued)

FOREIGN PATENT DOCUMENTS

| | | |
|---|---|---|
| KR | 940001590 B1 | 2/1994 |
| KR | 100673128 B1 | 1/2007 |
| KR | 20100087324 A | 8/2010 |

OTHER PUBLICATIONS

Extended European Search Report Appln. No. 12763548.0-1805; Dated Feb. 4, 2015.

(Continued)

*Primary Examiner* — Scott Sun
(74) *Attorney, Agent, or Firm* — Ladas & Parry LLP

(57) ABSTRACT

Disclosed is a method of reading data from a memory including a NAND cell array for performing communications via a serial peripheral interface (SPI) bus. The method includes sequentially receiving inputs of a block address, a word-line address, and a bit-line address of the NAND cell array; and starting to output data written in the NAND cell array immediately after the bit-line address is completely input. In this case, the sequential receiving of the inputs is performed via one input terminal.

15 Claims, 8 Drawing Sheets

(56) References Cited

U.S. PATENT DOCUMENTS

2009/0103362 A1    4/2009  Pekny et al.
2011/0066920 A1*  3/2011  Yu ...................... G06F 11/1064
                                                                             714/758

OTHER PUBLICATIONS

International Search Report mailed Oct. 29, 2012; PCT/KR2012/002049.

* cited by examiner

MEMORY, AND METHOD OF READING DATA FROM THE MEMORY

TECHNICAL FIELD

The present invention relates to a memory and a method of reading data from the memory, and more particularly, to a memory for receiving an input of an address via one input terminal and including a NAND cell array, and a method of reading data from the memory.

BACKGROUND ART

A serial peripheral interface (SPI) bus may be used as an interface for communications with a memory device including a NOR cell array. The SPI bus has been suggested by Motorola and is broadly used. The SPI bus is a communication standard between one master device and one or more slave devices, and generally uses a clock frequency of 1 MHz to 100 MHz. A slave device includes a tri-state output terminal, and allows full duplex data communications. A slave device may generally include one clock terminal, one input terminal, one output terminal, and one chip selection terminal.

When an SPI bus is used for a memory including a NOR cell array, the memory may operate as a slave device. In this case, an instruction, an address, and data may be input via one input terminal included in the memory. Since data is read in units of a word or a byte by using a large cell current, a memory including a NOR cell array has a very short random read time. Accordingly, if a read instruction and an address are input to a memory having a NOR cell array via an SPI bus, stored data may be output immediately after the address is completely input.

However, even when an SPI bus is used for a memory including a NOR cell array, if a clock speed is very high, for example, equal to or higher than 70 MHz, data may be output after a predetermined time from when an address is completely input.

DETAILED DESCRIPTION OF THE INVENTION

Technical Problem

According to an embodiment of the present invention, a serial peripheral interface (SPI) bus is used to control a memory including a NAND cell array.

A read process of a memory including a NAND cell array is basically performed in units of a page. Since a time for accessing a first page is, for example, about several hundred nanoseconds, in comparison to a memory including a NOR cell array, a random read time is relatively very long (the above time for accessing the first page may be reduced depending on a technical level). Accordingly, if a memory having a NAND cell array is read by using an SPI bus, data stored at an address may be output after a predetermined time passes from when the address is input.

As such, according to an embodiment of the present invention, when a memory having a NAND cell array is read via an SPI bus, a method of outputting data 'immediately after' a read instruction and an address are input is provided. Here, 'immediately after' refers to a time point of a clock next to the clock when an address is completely input. Also, a memory using the method is provided.

According to another embodiment of the present invention, when a memory having a NAND cell array is read via an SPI bus, a method of outputting data after a predetermined time from when a read instruction and an address are input, and a memory using the method are provided.

The scope of the present invention is not limited thereto.

Technical Solution

In order to solve the above problems, according to an embodiment of the present invention, when a memory having a NAND cell array is controlled by a serial peripheral interface (SPI) bus, since an address of the NAND cell array is input via one input terminal, a fact that a considerably large amount of free time may be ensured until the address is completely input is used. For example, if the address of the NAND cell array includes a total of 24 bits, a fact that the address is input for a total of 24 clocks may be used.

A predetermined time may be taken to provide a desired voltage to each cell in order to read a first page of a memory including a NAND cell array. By overlapping a time for inputting an address to a memory including a NAND cell array using an SPI bus with the above predetermined time, data may be read immediately after the address is completely input.

According to an aspect of the present invention, there is provided a method of reading data written in a NAND cell array included in a memory, the method including sequentially receiving inputs of a block address, a word-line address, and a bit-line address of the NAND cell array; and starting to output the data written in the NAND cell array immediately after the bit-line address is completely input. The sequential receiving of the inputs is performed via one input terminal.

According to another aspect of the present invention, there is provided a method of reading data written in a NAND cell array included in a memory, the method including sequentially receiving inputs of a block address and a word-line address of the NAND cell array; starting to drive word-lines included in a block corresponding to the block address; receiving an input of a bit-line address of the NAND cell array; and starting to output the data written in the NAND cell array after a period of a predetermined number of dummy bits from when the bit-line address is completely input. The block address, the word-line address, and the bit-line address are input via one input terminal. The period of the predetermined number of dummy bits may correspond to, for example, 8 or more clocks.

According to another aspect of the present invention, there is provided a memory including a first input terminal; a NAND cell array; and a control logic configured to receive an input of an address of the NAND cell array from the first input terminal and to output data written at the address. In this case, the control logic is configured to sequentially receive inputs of a block address, a word-line address, and a bit-line address included in the address; and to start to output the data written at the address immediately after the bit-line address is completely input. The block address, the word-line address, and the bit-line address may be sequentially input in the listed order.

Advantageous Effects

According to an embodiment of the present invention, when a memory having a NAND cell array is read via a serial peripheral interface (SPI) bus, data may be output immediately after a read instruction and an address are input. Alternatively, data may be output after a predetermined time passes from when the address is input.

The scope of the present invention is not limited thereto.

BEST MODE

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. The terminology used herein is for the purpose of describing particular embodiments and is not intended to limit the invention. As used herein, the singular forms "a", "an", and "the" are intended to include the plural forms as well, unless the context clearly indicates otherwise.

A non-volatile memory device according to embodiments of the present invention may refer to a memory device capable of retaining data even when power is cut off. For example, the non-volatile memory device may include a flash memory, an electrically erasable programmable read-only memory (EEPROM), a phase-change random access memory (PRAM), a magnetic random access memory (MRAM), or a resistive random access memory (RRAM). The flash memory may also be referred to as a floating gate memory, a charge trapping memory, or a silicon-oxide-nitride-oxide-silicon (SONOS) memory, and the above names do not limit the scope of the embodiments.

Figure 1:
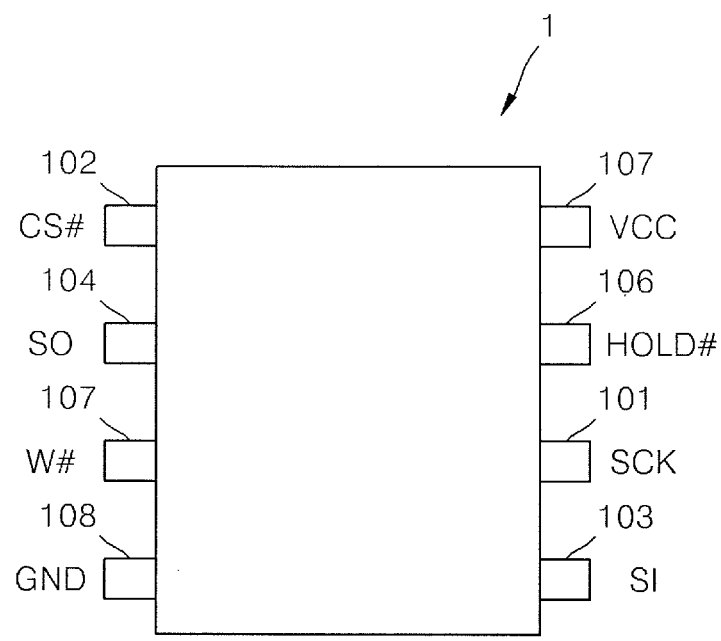
FIG. 1 is a diagram showing a pin-out structure of a memory, according to an embodiment of the present invention.

FIG. 1 is a diagram showing a pin-out structure of a memory 1, according to an embodiment of the present invention.

Referring to FIG. 1, the SCK 101 is a clock input terminal for receiving an input of a timing signal to the memory 1. The SI 103 is a terminal for receiving an input of, for example, an instruction, an address, or data to the memory 1. The VCC 107 is a terminal for inputting a power supply voltage, and the GND 108 is a terminal for receiving an input of a reference voltage with respect to the VCC 107. The SO 104 is a terminal for outputting data from the memory 1.

The CS #102 is a terminal for receiving an input of a memory selection signal. If a signal for not selecting the memory 1 is input, the SO 104 may be in a high impedance state. The HOLD #106 may be used to interrupt communications between the memory 1 and another apparatus, or to output data of the memory 1. The W #105 may be used to freeze the size of an anti-program or anti-erase area of the memory 1, or may be used to output data of the memory 1.

The memory 1 may be used as a slave device in communications using a serial peripheral interface (SPI) bus, and the SCK 101, the CS #102, the SI 103, and the SO 104 may respectively correspond to a clock terminal, a chip selection terminal, an input terminal, and an output terminal of the SPI bus.

Figure 2:
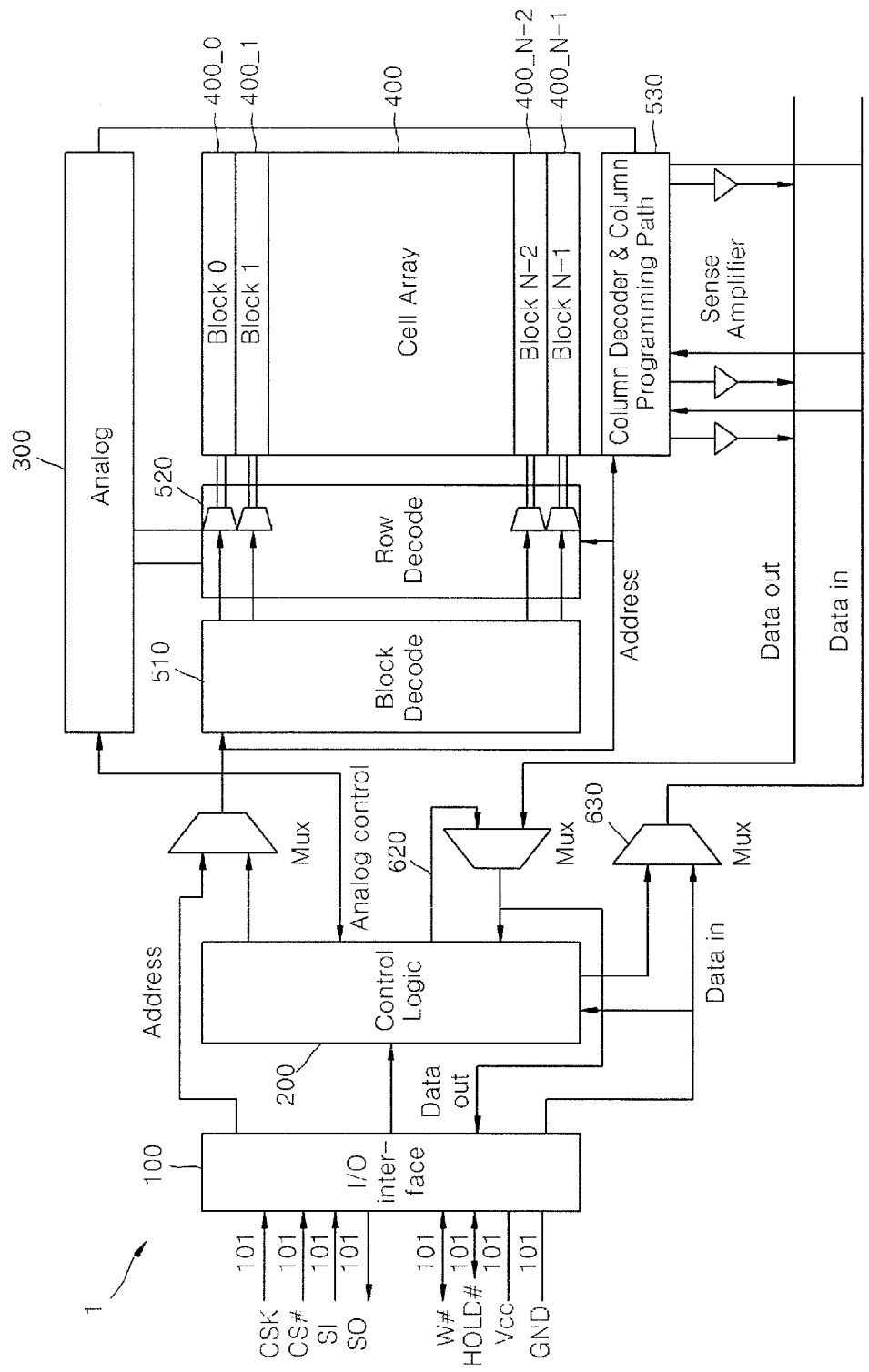
FIG. 2 is a schematic diagram showing the internal structure of a memory, according to an embodiment of the present invention.

FIG. 2 is a schematic diagram showing the internal structure of the memory 1, according to an embodiment of the present invention.

The memory 1 may include an input/output (I/O) interface 100, a control logic 200, an analog block 300, a cell array 400, address decoder blocks 510, 520, and 530, and multiplexers 610, 620, and 630.

The I/O interface 100 may be connected to various pin-out terminals described above in relation to FIG. 1. The control logic 200 may receive an input of, for example, clocks, an address, data, or a chip selection signal from the I/O interface 100, and may analyze it to control the address decoder blocks 510, 520, and 530, the analog block 300, or the I/O pad 100. The analog block 300 may include a circuit for providing power to the cell array 400 and the address decoder blocks 510, 520, and 530, and may be controlled by the control logic 200.

According to an embodiment of the present invention, the cell array 400 may be formed as a NAND cell array, and may have a two-dimensional (2D) matrix structure of columns and rows. Each row may be referred to as a word-line, and each column may be referred to as a bit-line. Also, the cell array 400 may be divided into N blocks 400_0 through 400_N-1.

An address input to the memory 1 may designate a certain area of the cell array 400, and may include a block address, a word-line address, and a bit-line address. A block decoder (510), a row decoder (520), and a column decoder (530) may respectively decode the block address, the word-line address, and the bit-line address so as to select a block, a word-line, and a bit-line. One or more multiplexers 610, 620, and 630 may be disposed on internal paths for transmitting input data and output data in the memory 1.

Figure 3:
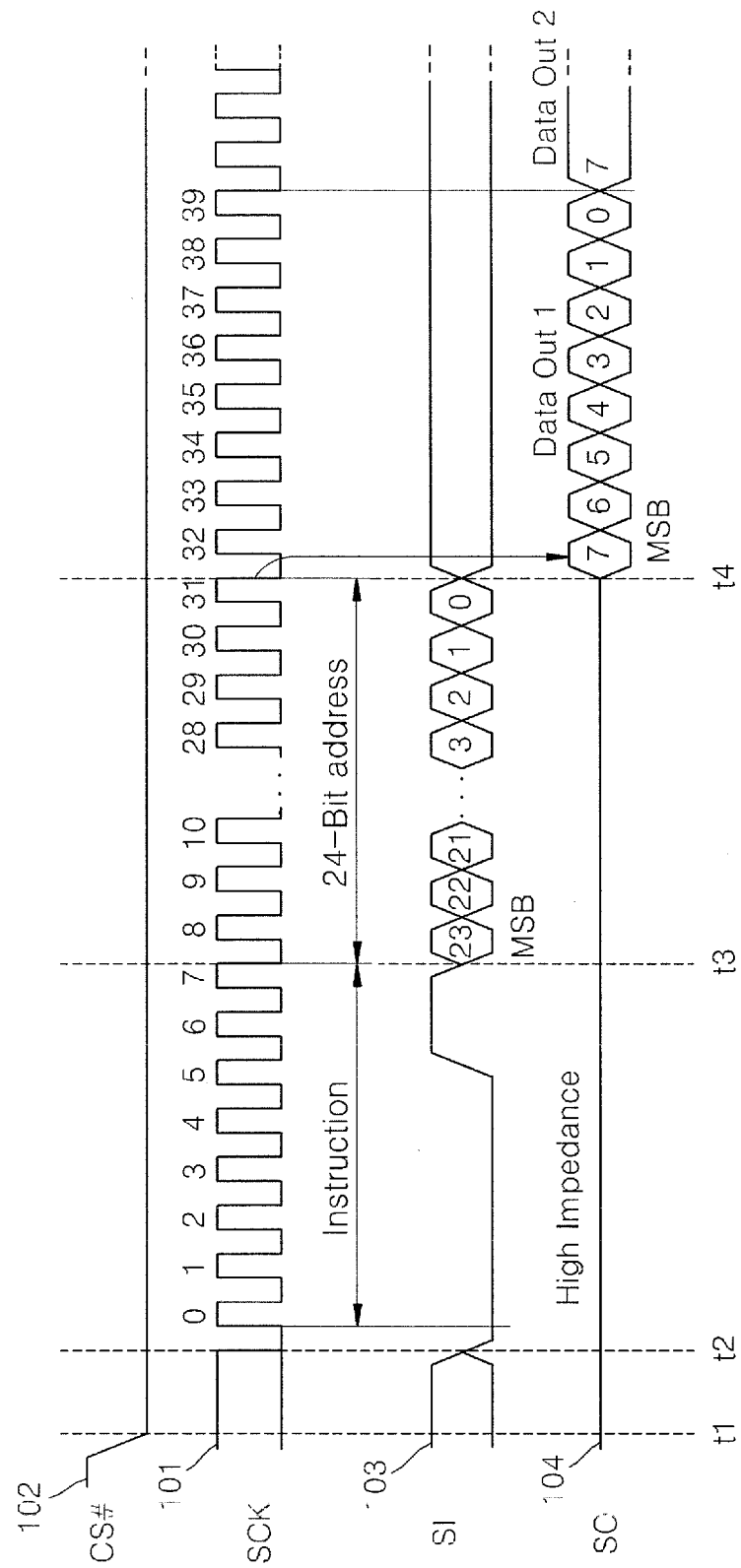
FIG. 3 is a timing diagram of a read process of a memory including a NAND cell array, according to an embodiment of the present invention.

FIG. 3 is a timing diagram of a read process of a memory including a NAND cell array, according to an embodiment of the present invention.

Hereinafter, "[a, b]" refers to a period between a time point a and a time point b in the timing diagram.

Four signals shown in FIG. 3 include signals of the SCK 101, the CS #102, and the SI 103, which are input to the memory, and a signal of the SO 104, which is output from the memory. If a chip selection signal is input via the CS #102 at a time point t1, clocks start to be input via the SCK 101 from a time point t2. Then, an instruction signal is input via the SI 103 for 8 clocks ([t2, t3]). After that, a 24-bit address is input for 24 clocks via the SI 103 ([t3, t4]). If the input instruction signal instructs to read data ('0000011'), data stored at the input address is output via the SO 104 'immediately after' the 24-bit address is completely input. Here, 'immediately after' refers to a clock next to the clock when the address completely input. Also, the clocks input via the SCK 101 do not have a length increased as time passes, and are repeatedly input at equal intervals after the time point t1.

In order to read data stored in the NAND cell array, a voltage of 0V may be input to a gate of a memory cell corresponding to the input address, and a voltage of about 4.5V or about 5.0V may be applied to gates o the other memory cells. Also, a voltage between about 1.0V and about 1.8V may be applied to a bit-line of the memory cell. A word-line of the memory cell may be connected to the gate of the memory cell, and the bit-line of the memory cell may be connected to a drain of the memory cell. When data is read from a general NAND cell array, word-lines start to be driven and bit-lines start to be precharged after an address is completely input. In this case, a predetermined time is taken to reach a desired voltage level. Although the taken time may differ depending on a technical level, for example, a time of about 80 nanoseconds (ns) to about 100 ns may be taken. Accordingly, in the general NAND cell array, the data may not be output 'immediately after' the 24-bit address is completely input as illustrated in FIG. 3. However, according to an embodiment of the present invention, the timing diagram of FIG. 3 may be satisfied. For this, a method described below with reference to FIGS. 4 and 5 may be used.

Figure 4:
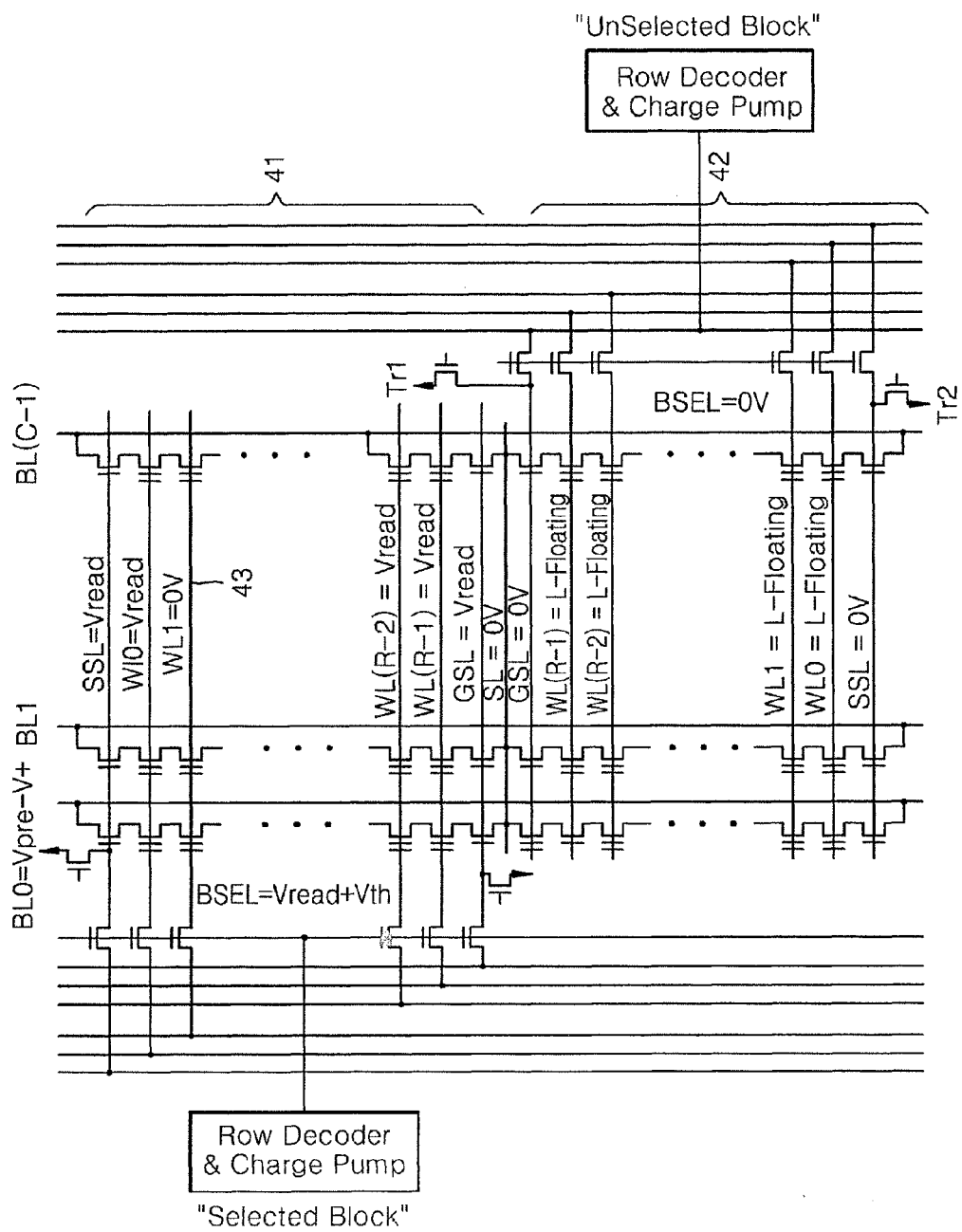
FIG. 4 is a diagram showing a portion of a NAND cell array included in a memory, according to an embodiment of the present invention.

FIG. 4 is a diagram showing a portion of a NAND cell array included in a memory, according to an embodiment of the present invention.

The NAND cell array may be divided into a plurality of blocks, and FIG. 4 shows the structure of two of the plurality of blocks, for example, a first block 41 and a second block 42. Here, it is assumed that the first block 41 is selected by the above-described block address input to the memory. Also, FIG. 4 shows voltages of a plurality of nodes, which are required to read a word-line WL1 43 of the first block 41.

In order to read data written in the word-line WL1 43 of the selected first block 41, 0V may be applied to the word-line WL1 43, a voltage Vread may be applied to the other word-lines, and a voltage Vpre-Vt may be applied to a bit-line to be read from among a plurality of bit-lines BL0 through BL(C-1). The voltage Vread may be, for example, about 4.5V or about 5.0V, and a voltage Vpre may be, for example, a voltage between about 1.0V and about 1.8V. A voltage Vt may be a threshold voltage of an n-channel metal oxide semiconductor field effect transistor (NMOS).

Here, WL0 through WL(R-1) may be referred to as NAND strings. For example, R=16, and C=4225, where C is a constant indicating the number of bit-lines. However, the above values may vary according to an embodiment.

In FIG. 4, all word-lines of the second block 42 that is an unselected block may be maintained in a low state, and string selection lines SSL and GSL of the second block 42 may be maintained in a grounded state (0V) by ground transistors Tr1 and Tr2. Accordingly, a current does not flow through NAND strings of the second block 42.

An address including a block address, a word-line address, and a bit-line address may be input to the memory and, in this case, the block address, the word-line address, and the bit-line address may be sequentially input. If the input block address and the word-line address respectively designate the first block 41 and the word-line WL1 43 illustrated in FIG. 4, in order to prepare to read data written in the word-line WL1 43, voltages of a plurality of nodes of the NAND cell array need to be changed and/or maintained as the above-described voltages shown in FIG. 4.

In order to achieve the voltages shown in FIG. 4, each word-line may be driven and each bit-line may be precharged. A method of driving word-lines and precharging a bit-line is shown in FIG. 5.

Figure 5:
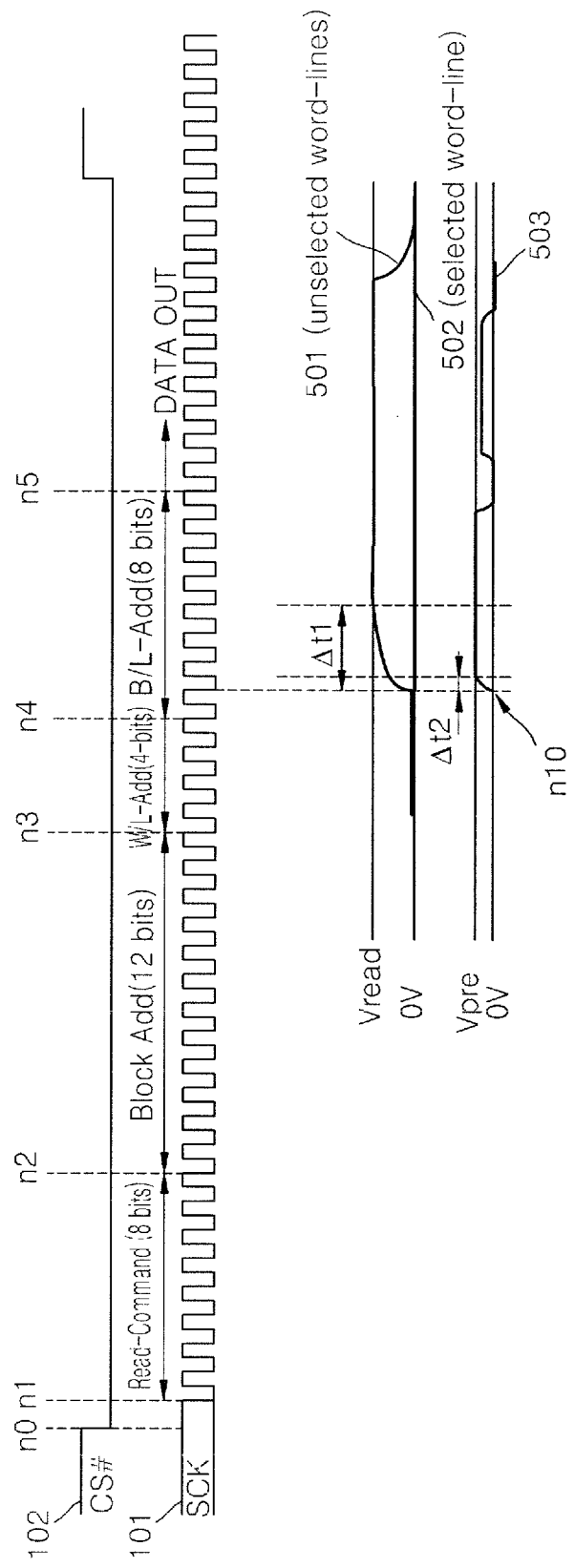
FIG. 5 is a diagram showing a read process of a memory including a NAND cell array, according to an embodiment of the present invention.

FIG. 5 is a diagram showing a read process of a memory including a NAND cell array, according to an embodiment of the present invention.

Referring to FIG. 5, an address [n2, n5] input to the memory may include a 12-bit block address [n2, n3], a 4-bit word-line address [n3, n4], and an 8-bit bit-line address [n4, n5]. If the memory is selected at a time point n0 by the CS #102, clocks are input from a time point n1 via the SCK 101, and a memory read instruction is input for 8 clocks in a time period [n1, n2]. Data is output from a time point n5 when the bit-line address [n4, n5] is completely input.

In order to read data written in a memory cell corresponding to the input block address [n2, n3], the word-line address [n3, n4], and the bit-line address [n4, n5], as described above in relation to FIG. 4, word-lines of a block including the memory cell may be driven and a bit-line corresponding to the memory cell may be precharged.

Alternatively, according to an embodiment of the present invention, in order to read one or more of all memory cells designated by the block address [n2, n3] and the word-line address [n3, n4], as described above in relation to FIG. 4, word-lines of a block including the all memory cells may be driven and bit-lines corresponding to the one or more memory cells may be precharged. For this, only the block address [n2, n3] and the word-line address [n3, n4] of the input address [n2, n5] are required.

However, in FIG. 5, since the address [n2, n5] is input via only one input terminal, i.e., the SI 103(not shown in FIG. 5), the block address [n2, n3] and the word-line address [n3, n4] may be completely input before the bit-line address [n4, n5] is completely input. Accordingly, before the time point n5 when the bit-line address [n4, n5] is completely input, word-lines may start to be driven (n10) and bit-lines may start to be precharged (n10). Alternatively, word-lines may start to be driven and bit-lines may start to be precharged immediately after a time point n4 when the word-line address [n3, n4] is completely input. Here, 'immediately after' refers to a time point n10 when one clock passes after the time point n4.

In general, a voltage for reading a NAND cell array may be reached when, for example, a time of several hundred nanoseconds passes after word-lines start to be driven and bit-lines start to be precharged in the NAND cell array. However, according to an embodiment of the present invention, since word-lines start to be driven and bit-lines start to be precharged (n10) before the bit-line address [n4, n5] is completely input, data of the NAND cell array may be read immediately after the bit-line address [n4, n5] is completely input.

According to another embodiment of the present invention, word-lines may start to be driven and bit-lines may start to be precharged about 80 ns to about 100 ns before the bit-line address [n4, n5] is completely input, and thus data of the NAND cell array may be read immediately after the bit-line address [n4, n5] is completely input.

A voltage variation 502 of a word-line selected by the word-line address [n3, n4] (a selected word-line) as time passes and a voltage variation 501 of the other unselected word-lines(unselected word-lines, pass word-lines) as time passes are shown in FIG. 5. The voltage of the selected word-line reaches the voltage Vread after a time Δt1 passes from the time point n10 when word-lines start to be driven.

Also, FIG. 5 shows a voltage variation 503 of a bit-line of a NAND cell. The voltage of the selected bit-line reaches the voltage Vpre after a time Δt2 passes from the time point n10 when bit-lines start to be precharged.

If data written in the selected word-line is completely read, voltages of all word-lines and bit-lines of a block designated by the block address [n2, n3] may be changed to a reference voltage, for example, 0V.

Figure 6:
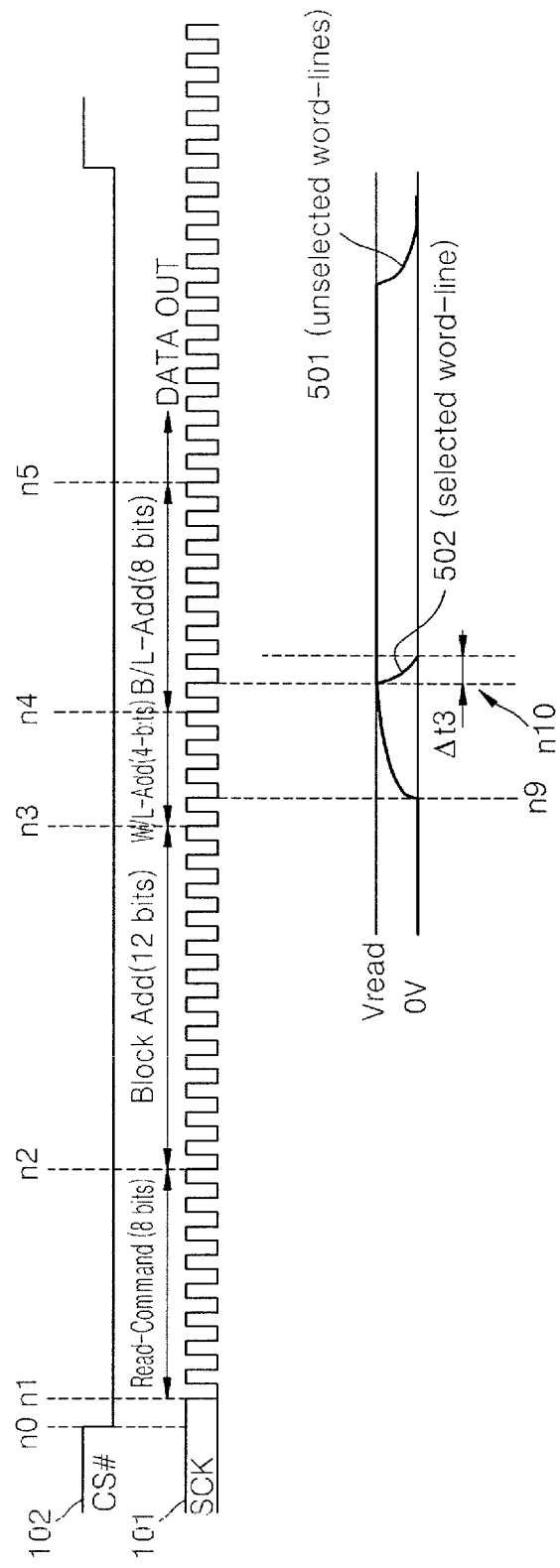
FIG. 6 is a diagram for describing a method of driving word-lines, according to another embodiment of the present invention.

FIG. 6 is a diagram for describing a method of driving word-lines, according to another embodiment of the present invention.

Referring to FIG. 6, if the block address [n2, n3] is completely input, even before the word-line address [n3, n4] is completely input, it may be determined which block has word-lines to be driven. Accordingly, voltages of all word-lines included in a block designated by the block address [n2, n3] may be increased to the voltage Vread at a time point n9 (501, 502). Then, if the word-line address [n3, n4] is completely input, only a voltage of a word-line selected by the word-line address [n3, n4] (502) may be reduced to a reference voltage (for example, 0V). In this case, a time point for starting to reduce the voltage may be the time point n10. In this case, the voltage of the selected word-line reaches the reference voltage after a time Δt3 passes from the time point n10 for starting to reduce the voltage.

In general, the time Δt3 taken to reduce the, voltage of the selected word-line in FIG. 6 is less than the time Δt1 taken to increase the voltages of the unselected word-lines in FIG. 5. Accordingly, if the word-lines are driven by using the method of FIG. 6, a voltage required to read the NAND cell array may be reached earlier in comparison to the method of FIG. 5.

Figure 7:
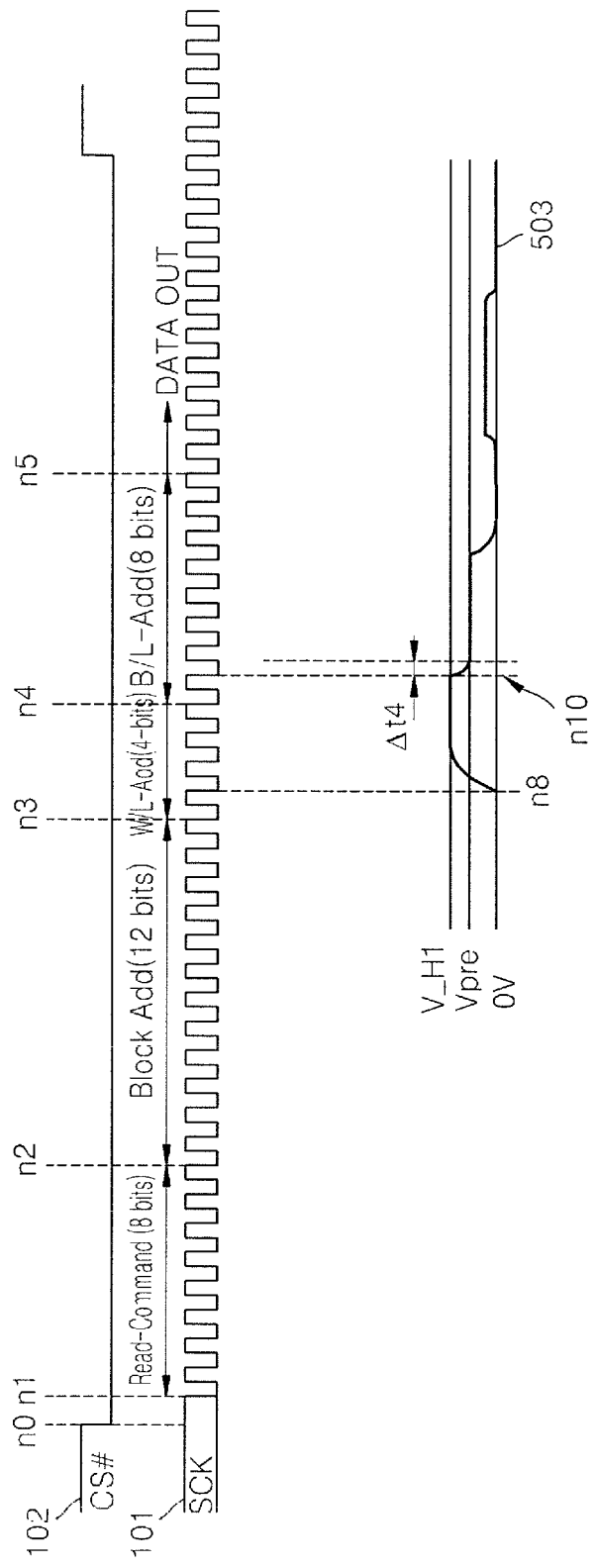
FIG. 7 is a diagram for describing a method of precharging bit-lines, according to another embodiment of the present invention.

FIG. 7 is a diagram for describing a method of precharging bit-lines, according to another embodiment of the present invention.

Referring to FIG. 7, if the block address [n2, n3] is input, even before the word-line address [n3, n4] is completely input, it may be determined which block has bit-lines to be precharged. Accordingly, voltages of all bit-lines included in a block designated by the block address [n2, n3] may be increased to a voltage V_H1 at a time point n8. After the voltages of the bit-lines are increased to the voltage V_H1, the voltages of the bit-lines may be reduced to the voltage Vpre. As described above, the voltages of the bit-lines may start to be reduced at the time point n10 after the word-line address [n3, n4] is completely input, but the time point is not limited to n10. In this case, the voltages of the bit-lines reach the voltage Vpre after a time Δt4 passes from the time point n10.

In general, the time Δt4 taken to reduce the voltages of the bit-lines in FIG. 7 is less than the time Δt2 taken to increase the voltages of the bit-lines in FIG. 5. Accordingly, if the bit-lines are precharged by using the method of FIG. 7, a voltage required to read the NAND cell array may be reached earlier in comparison to the method of FIG. 5.

It would be easily understood that the methods of FIGS. 6 and 7 may be performed separately or together.

Figure 8:
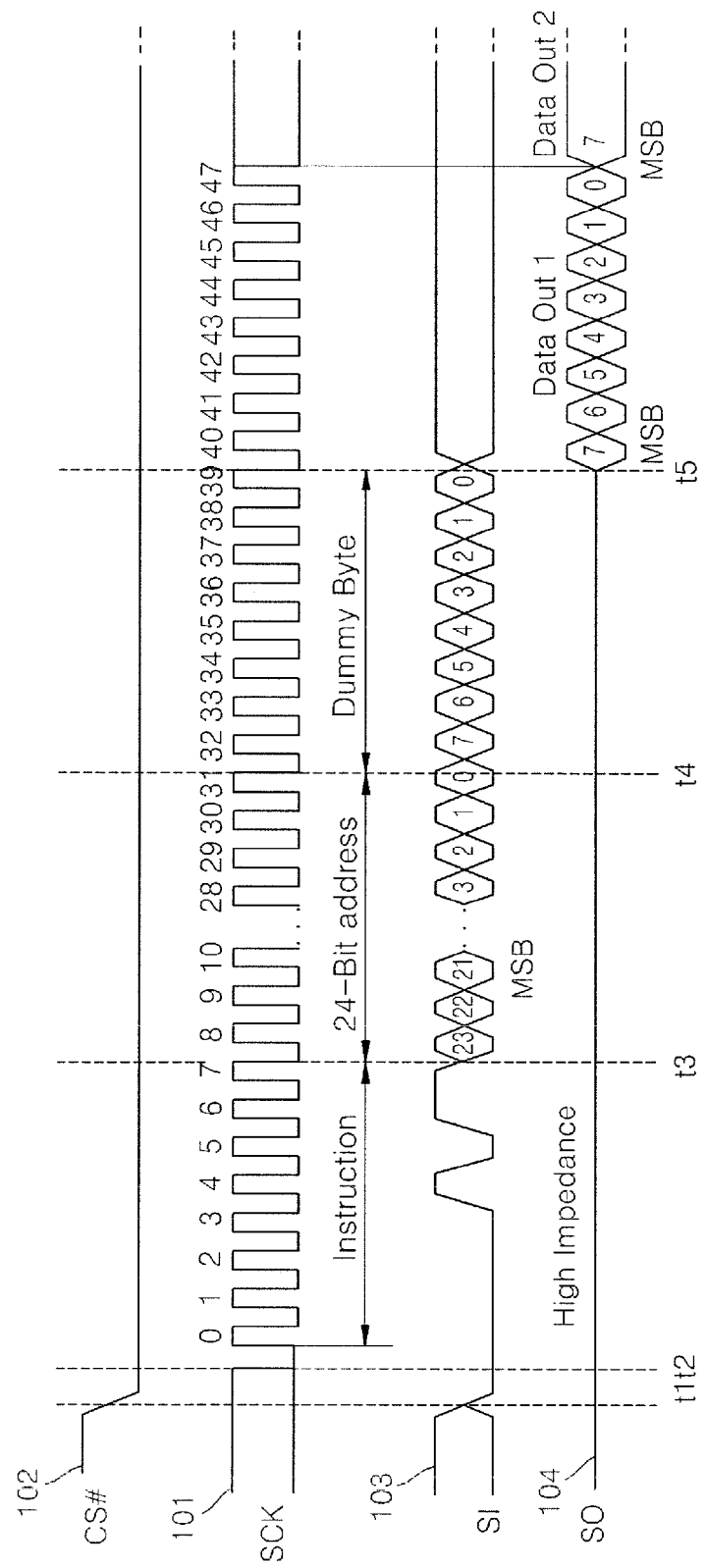
FIG. 8 is a timing diagram of a read process of a memory including a NAND cell array, according to another embodiment of the present invention.

FIG. 8 is a timing diagram of a read process of a memory including a NAND cell array, according to another embodiment of the present invention.

Four signals shown in FIG. 8 include signals of the SCK 101, the CS #102, and the SI 103, which are input to the memory, and a signal of the SO 104, which is output from the memory. If a chip selection signal is input via the CS #102 at the time point t1, clocks start to be input via the SCK 101. The SCK 101 may have a high clock speed, for example, a clock speed equal to or higher than 70 MHz. Then, an instruction signal is input via the SI 103 for a predetermined time, for example, for 8 clocks ([t2, t3]). After that, a 24-bit address is input for 24 clocks via the SI 103 ([t3, t4]). If the input instruction signal instructs to read data, data stored at the input address is output via the SO 104 after a time corresponding to predetermined dummy bits, for example, 8 dummy bits ([t4, t5]) passes from when the 24-bit address is completely input.

The method of FIG. 8 is appropriate when a clock speed is high. Referring back to FIGS. 5 through 7, 24 clocks are taken from a time point n2 when word-lines start to be driven to the time point n5 when the bit-line address [n4, n5] is completely input. Appropriately, a preparation for reading the NAND cell array is completed for a time of these 24 clocks. As described above, in general, about 80 ns to about 100 ns may be taken for the preparation (a shorter time may be taken according to an embodiment). If the clock speed is very high and thus a time taken when seven clocks pass is less than, for example, 100 ns, data may not be read immediately after the time point n5 when the bit-line address [n4, n5] is completely input. For example, if the clock speed is equal to or higher than about 70 MHz (=1/(100 ns/7)), a time taken when seven clocks pass is less than 100 ns. Accordingly, as illustrated in FIG. 8, since the above-described 100 ns may be achieved by providing a break time for predetermined dummy bits, for example, 8 dummy bits ([t4, t5]) after the address is completely input, data may be output immediately after a time point t5.

The method of FIG. 8 may be combined with the method of FIGS. 5 through 7.

The control logic 200 of FIG. 2 may control the analog block 300 so as to adjust the timings for driving word-lines and precharging bit-lines in FIGS. 5 through 7.

It is obvious that a pin-out structure of a memory, according to an embodiment of the present invention, may be modified from that illustrated in FIG. 1 within the scope of the present invention. That is, the memory 1 may include only 6 terminals such as the SCK 101, the CS #102, the SI 103, the SO 104, the VCC 107, and the GND 108, or may further include the W #105 and the HOLD #106.

Embodiments of the present invention will now be described with reference to FIGS. 1 through 8.

An embodiment of the present invention method relates to a method of reading data written in the NAND cell array 400 included in the memory 1. The method includes sequentially receiving inputs of the block address [n2, n3], the word-line address [n3, n4], and the bit-line address [n4, n5] of the NAND cell array 400. After that, the data written in the NAND cell array 400 starts to be output immediately after the bit-line address [n4, n5] is completely input. In more detail, data designated by the block address [n2, n3], the word-line address [n3, n4], and the bit-line address [n4, n5] starts to be output. In this case, the sequential receiving of the inputs may be performed via the SI 103. Here, 'immediately after' may refer to a clock next to the clock when a last bit of the bit-line address [n4, n5] is input.

The method may further include starting to drive word-lines included in a block corresponding to the block address [n2, n3], before the bit-line address [n4, n5] is completely input. Alternatively, the method may further include starting to drive word-lines included in a block corresponding to the block address [n2, n3], 80 ns before the data starts to be output. In this case, the driving may include increasing voltages of all word-lines in the block to a predetermined first voltage (Vread), and then reducing a voltage of a word-line corresponding to the word-line address [n3, n4], to a predetermined second voltage (GND).

The method may further include starting to precharge bit-lines included in a block corresponding to the block address [n2, n3], before the bit-line address [n4, n5] is completely input. Alternatively, the method may further include starting to precharge bit-lines included in a block corresponding to the block address [n2, n3], 80 ns before the data starts to be output. In this case, the precharging includes increasing voltages of bit-lines in the block to a predetermined third voltage (V_H1), and then reducing to a predetermined fourth voltage (Vpre).

Another embodiment of the present invention relates to a method of reading data written in the NAND cell array 400 included in the memory 1. The method includes sequentially receiving inputs of the block address [n2, n3] and the word-line address [n3, n4] of the NAND cell array 400. After that, word-lines included in a block corresponding to the block address [n2, n3] may start to be driven. Then, the method may further include receiving an input of the bit-line address [n4, n5] of the NAND cell array 400; and starting to output the data written in the NAND cell array 400 after a period of a predetermined number of dummy bits from when the bit-line address [n4, n5] is completely input. In more detail, data designated by the block address [n2, n3] and the word-line address [n3, n4], the bit-line address [n4, n5] may start to be output. In this case, the block address [n2, n3], the word-line address [n3, n4], and the bit-line address [n4, n5] may be input via the SI 103.

The method may further include starting to precharge bit-lines included in the block before the bit-line address [n4, n5] is completely input. Also, the period of the predetermined number of dummy bits may correspond to 8 clocks.

Another embodiment of the present invention relates to the memory 1 including the SI 103; the NAND cell array 400; and the control logic 200 configured to receive an input of the address [n2, n5] of the NAND cell array 400 from the SI 103 and to output data written at the address [n2, n5]. In this case, the control logic 200 is configured to sequentially receive inputs of the block address [n2, n3], the word-line address [n3, n4], and the bit-line address [n4, n5] included in the address [n2, n5]; and to start to output the data written at the address [n2, n5] immediately after the bit-line address [n4, n5] is completely input.

Alternatively, the control logic 200 may be configured to start to output the data written at the address [n2, n5] immediately after a period of a predetermined number of dummy bits from when the bit-line address [n4, n5] is completely input, In this case, the control logic 200 may be configured to start to drive word-lines included in a block corresponding to the block address [n2, n3], before the bit-line address [n4, n5] is completely input.

In this case, the control logic 200 may be configured to start to precharge bit-lines included in a block corresponding to the block address [n2, n3], before the bit-line address [n4, n5] is completely input.

A memory according to an embodiment of the present invention may be used in, for example, a computer, a cellular phone, a mobile device, a personal digital assistant (PDA), a navigation device, or a home appliance.

While the present invention has been particularly shown and described with reference to exemplary embodiments thereof, it will be understood by one of ordinary skill in the art that various changes in form and details may be made therein without departing from the spirit and scope of the invention as defined by the following claims.

The exemplary embodiments should be considered in a descriptive sense only and not for purposes of limitation. Therefore, the scope of the invention is defined not by the detailed description of the invention but by the following claims, and all differences within the scope will be construed as being included in the present invention.

The invention claimed is:

1. A method of reading data written in a NAND cell array comprised in a memory, the method comprising:
   sequentially receiving inputs of a block address, a word-line address, and a bit-line address of the NAND cell array; and
   starting to output data written in the NAND cell array immediately after the bit-line address is completely input,
   wherein the receiving the inputs is performed via one input terminal.

2. The method of claim 1, further comprising starting to drive word-lines comprised in a block corresponding to the block address, before the bit-line address is completely input.

3. The method of claim 2, further comprising starting to drive word-lines comprised in the block corresponding to the block address, at least several ten nanoseconds before the data starts to be output.

4. The method of claim 2, wherein the driving comprises increasing voltages of all word-lines in the block to a predetermined first voltage, and then reducing a voltage of a word-line corresponding to the word-line address to a predetermined second voltage.

5. The method of claim 1, further comprising starting to precharge a bit-line comprised in a block corresponding to the block address, before the bit-line address is completely input.

6. The method of claim 5, further comprising starting to precharge a bit-line comprised in the block corresponding to the block address, at least several ten nanoseconds before the data starts to be output.

7. The method of claim 5, wherein the precharging comprises increasing voltages of bit-lines in the block to a predetermined first voltage, and then reducing to a predetermined second voltage.

8. A method of reading data written in a NAND cell array comprised in a memory, the method comprising:
   Sequentially receiving inputs of a block address and a word-line address of the NAND cell array;
   starting to drive word-lines comprised in a block corresponding to the block address;
   receiving an input of a bit-line address of the NAND cell array; and
   starting to output the data written in the NAND cell array immediately after a period of a predetermined number of dummy bits from when the bit-line address is completely input,
   wherein the block address, the word-line address, and the bit-line address are input via one input terminal.

9. The method of claim 8, further comprising starting to precharge a bit-line comprised in the block before the bit-line address is completely input.

10. The method of claim 8, wherein the period of the predetermined number of dummy bits corresponds to 8 clocks.

11. A memory comprising:
    a first input terminal;
    a NAND cell array; and
    a control logic configured to receive an input of an address of the NAND cell array from the first input terminal and to output data written at the address,
    wherein the control logic is configured to sequentially receive inputs of a block address, a word-line address, and a bit-line address comprised in the address; and to start to output the data written at the address immediately after the bit-line address is completely input.

12. The memory of claim 11, wherein the control logic is configured to start to drive word-lines comprised in a block corresponding to the block address, before the bit-line address is completely input.

13. The memory of claim 11, wherein the control logic is configured to start to precharge a bit-line comprised in a block corresponding to the block address, before the bit-line address is completely input.

14. The memory of claim 11, wherein the control logic is configured to start to output the data written at the address immediately after a period of a predetermined number of dummy bits from when the bit-line address is completely input.

15. The memory of claim 14, wherein the period of the predetermined number of dummy bits corresponds to 8 clocks.

* * * * *